United States Patent [19]

Gill, Jr.

[11] 4,437,023

[45] Mar. 13, 1984

[54] CURRENT MIRROR SOURCE CIRCUITRY

[75] Inventor: Harry A. Gill, Jr., Cupertino, Calif.

[73] Assignee: Raytheon Company, Lexington, Mass.

[21] Appl. No.: 335,309

[22] Filed: Dec. 28, 1981

[51] Int. Cl.[3] .......................... H03K 3/01; G05F 3/20

[52] U.S. Cl. ................................ 307/296 R; 307/297; 323/315; 330/257

[58] Field of Search ................ 307/296, 297; 330/257, 330/288; 323/315, 316

[56] References Cited

U.S. PATENT DOCUMENTS

| | | | |
|---|---|---|---|
| 3,962,592 | 6/1976 | Thommen et al. | 323/315 |
| 4,029,974 | 6/1977 | Brokaw | 307/296 |
| 4,092,611 | 5/1978 | Fredericksen et al. | 330/257 |
| 4,092,639 | 5/1978 | Schoeff | 340/347 |
| 4,177,417 | 12/1979 | Henry et al. | 323/315 |
| 4,270,092 | 5/1981 | Christopherson | 323/316 |
| 4,292,584 | 9/1981 | Kusakabe | 323/316 |

*Primary Examiner*—Stanley D. Miller
*Assistant Examiner*—B. P. Davis
*Attorney, Agent, or Firm*—Richard M. Sharkansky; Joseph D. Pannone

[57] ABSTRACT

A current source circuit includes a current mirror circuit having a master transistor and at least one slave transistor. The master transistor is coupled to a differential amplifier. The differential amplifier includes a pair of transistors, one thereof being coupled to a reference current source and the master transistor and the other one having a collector electrode connected to the base electrodes of the master and slave transistors for producing a current through the collector electrode substantially equal to the total current flow through the base electrodes of the master and slave transistors.

1 Claim, 2 Drawing Figures

CURRENT MIRROR SOURCE CIRCUITRY

BACKGROUND OF THE INVENTION

This invention relates generally to current source circuitry and more particularly to current source circuitry having relatively high output impedances.

As is known in the art, current sources have a wide range of applications in linear integrated circuits. One such current source, a so-called "Wilson current source", is described in an article entitled "A Monolithic Junction FET n-p-n Operational Amplifier" by George A. Wilson in IEEE Journal of Solid-State Circuits, December 1968. Such current source improves on a conventional current source (which has a transistor with a diode coupled between its base and emitter to provide a current flow in the collector of the transistor substantially equal to a reference current fed to the junction of the diode and the base of such transistor) by adding a second transistor having its base coupled to the collector of the first transistor and its emitter connected to the junction of the diode and the base of the first transistor. With such arrangement, the current in the collector of the second transistor is substantially equal to a reference current passing to the junction of the collector of the first transistor and the base of the second transistor.

While this so-called "Wilson current source" is useful in a wide variety of applications, in some applications it is desirable that the current source have a relatively high output impedance, as where such current source is to be used with other transistors to provide current mirrors which "track" or "mirror" the current produced by the current source. The desirability of increasing the output impedance of the current source is to reduce the variations produced by the current source with variations in supply voltage.

SUMMARY OF THE INVENTION

In accordance with the present invention, an improved current source circuit is provided having: A pair of current sources; a current mirror circuit comprising a plurality of transistors having a common base, such plurality of transistors including a master transistor and at least one slave transistor, the emitter electrodes thereof being electrically connected to a voltage source; differential amplifier means comprising a pair of transistors having emitter electrodes connected to a first one of the pair of current sources, a first one of the pair of transistors having a base electrode coupled to a collector electrode of the master transistor and to the second one of the pair of current sources and a collector electrode coupled to the voltage source, and a second one of the pair of transistors having a collector electrode connected to the common base, for producing a current through the collector electrode of the second one of the pair of transistors substantially equal to the total current flow through the common base of the plurality of transistors of the current mirror circuit and for producing a current flow through the collector electrode of the at least one slave transistor substantially proportional to the current flow through the collector electrode of the master transistor.

With such arrangement, a relatively simple current source circuit is provided having a relatively high output impedance with substantially all the base current for the transistors in the current mirror circuit being supplied by the collector of the second one of the pair of transistors of the differential amplifier. Variations in the collector current of the master transistor are sensed as a change in the base current flowing through the first one of the pair of transistors of the differential amplifier. The change in base current is amplified by the differential amplifier to rapidly modify directly the base currents of the master and slave transistors.

BRIEF DESCRIPTION OF THE DRAWINGS

The aforementioned aspects and other features of the invention are explained more fully in the following description taken in connection with the accompanying drawings in which.

DESCRIPTION OF THE PREFERRED EMBODIMENT

Figure 1:
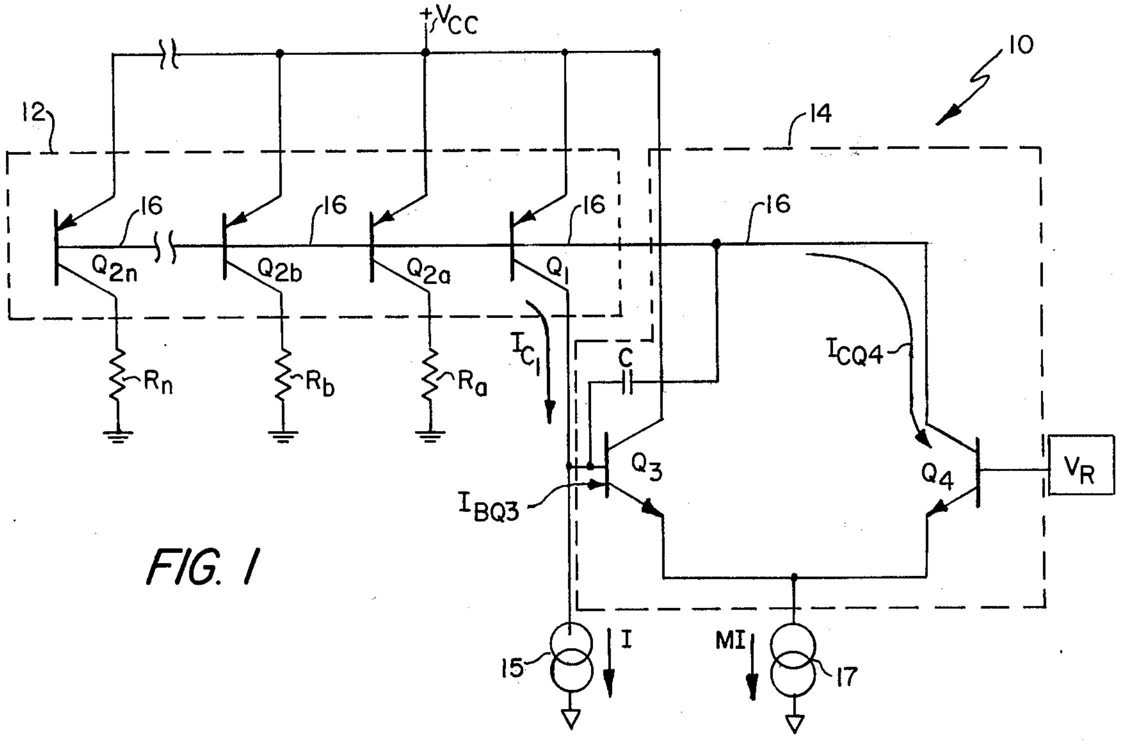
FIG. 1 is a schematic diagram of a current source circuit according to the invention.

Referring now to FIG. 1, a current source circuit 10 is shown to include a current mirror circuit 12 and a differential amplifier circuit 14, connected as shown. The current mirror circuit 12 includes a master transistor $Q_1$ and at least one slave transistor, here a plurality of slave transistors $Q_{2a}$–$Q_{2n}$ as shown. The master transistor $Q_1$ and the plurality of slave transistors $Q_{2a}$–$Q_{2n}$ have a common base electrode 16, as shown. The emitter electrodes of the plurality of transistors $Q_1$, $Q_{2a}$–$Q_{2n}$ in the current source circuit 12 are connected to a +Vcc voltage source as shown. The collector electrode of transistor $Q_1$ is connected to the differential amplifier circuit 14, as shown, and to a first reference current source 15 which produces a current flow, I, as shown. The collector electrodes of slave transistors $Q_{2a}$–$Q_{2n}$ are connected to respective loads, here shown as resistors $R_a$–$R_n$ connected as shown.

Differential amplifier circuit 14 includes a pair of transistors $Q_3$, $Q_4$, the base electrode of transistor $Q_3$ being connected to the collector of transistor $Q_1$ and to the first reference current source 15, as shown. The base electrode of transistor $Q_4$ is connected to a reference voltage source $V_R$ and the collector electrode of transistor $Q_4$ is coupled to the common base electrode 16 of the plurality of transistors $Q_1$, $Q_{2a}$–$Q_{2n}$ of the current mirror circuit 12, as shown. A compensating capacitor C, here 10 picofarads, is provided to stabilize the circuit 10, and is connected between the base electrode of transistor $Q_3$, as shown and the collector of transistor $Q_4$, as shown. Transistor $Q_3$ has its collector elecrode connected to the $+V_{cc}$ supply voltage. The emitter electrodes of transistors $Q_3$, $Q_4$ are connected together and are coupled to a second reference curent source 17 which produces a current flow MI, as shown where the current flow through the second reference current source 17 is M times the current flow through the first reference current source 15.

In operation, the voltage at the base of transistor $Q_3$ is substantially equal to the voltage $V_R$. Further, the loads represented by $R_a$–$R_n$ are selected such that the voltages at the collector electrodes of transistors $Q_{2a}$–$Q_{2n}$ are substantially equal to the voltage $V_R$. For example, if $V_{cc}$ is 15 volts and $V_R$ is 1.2 volts and the current source 15 produces a current I here equal to 150 microamperes (which is approximately equal to the current in the collector electrode of transistor $Q_1$, $I_{cl}$) and the emitter area of transistor $Q_{2a}$ is equal to the emitter area of transistor $Q_1$, then $R_a=8$ Kohms. If voltages at collectors of $Q_{2a}$–$Q_{2n}$ are equal to $V_R$ then the currents in collectors of $Q_{2a}$–$Q_{2n}$ will be equal, or be in direct proportion to the collector current of $Q_1$ depending on the ratios of the emitter areas of transistors $Q_{2a}$–$Q_{2n}$ to the emitter area of transistor $Q_1$. If the voltage $+V_{cc}$ increases, the collector current $I_{cl}$ of transistor $Q_1$ would "tend to" increase due to its finite collector output impedance, and the collector currents of trn sistors $Q_{2a}$–$Q_{2n}$ would "tend to" increase; however, any increase in the collector current $I_{cl}$, increases the base current of transistor $Q_3$ (i.e. $I_{BQ3}$). This increase in the base current $I_{BQ3}$ of transistor $Q_3$ increases the portion of emitter current being fed to the current source 17 from transistor $Q_3$ and reduces the portion of emitter current flow from transistor $Q_4$ to such current source 17. The reduced emitter current through transistor $Q_4$ then "tends to" reduce the current $I_{CQ4}$ in the collector of transistor $Q_4$. Since substantially all the base current of the transistors $Q_1$ and $Q_{2a}$–$Q_{2n}$ of the current mirror 12 passes through the collector of transistor $Q_4$ (i.e. $I_{CQ4}$) the reduced base currents "tend to" reduce the currents in the collectors of transistors $Q_1$ and $Q_{2a}$–$Q_{2n}$ so that such collector currents remains substantially constant and independent of variations in the voltage $+V_{cc}$. It is also noted that if the emitter area of transistor $Q_1$ is y and the emitter areas of transistors $Q_{2a}$–$Q_{2n}$ are Ay to Ny, respectively, the collector currents of transistors $Q_{2a}$–$Q_{2n}$ will be $AI_{cl}$ to $NI_{cl}$, respectively, where $I_{cl}$ is the collector current of transistor $Q_1$. Further, each one of the transistors $Q_{2a}$–$Q_{2n}$ conducts with a collector current proportional to the current in the collector of transistor $Q_1$; the proportionality constant being the ratio of the emitter area of the transistors $Q_{2a}$–$Q_{2n}$ to the emitter area of transistor $Q_1$, as noted above.

It is noted that MI, the level of the current produced by the second reference current source 17, must be greater than some minimum level based on the value of the reference current I produced by the first reference current source 15, and the minimum current gain (hfe) between the base and the collector electrodes of the transistors $Q_1$ and $Q_{2a}$–$Q_{2n}$. Here transistors $Q_1$ and $Q_{2a}$–$Q_{2n}$ are formed as part of an integrated circuit and therefore have substantially equal current gains. The minimum value of M is determined by assuming the collector current of transistor $Q_3$ is at, or near, zero and the hfe of transistors $Q_1$, $Q_{2a}$–$Q_{2n}$ is at its minimum value. Thus, if the collector current of transistor $Q_3$ is assumed zero, the current MI of the second reference current source 17 will be equal to the collector current of transistor $Q_4$. Further, the base current of transistor $Q_3$ will be zero so that the current through the collector of transistor $Q_1$ will be equal to the current produced by the first current source 15, i.e. $I_{cl}=I$. Therefore $I_{cQ4}+(I_{cl}/hfe)+(XI_{cl}/hfe)$ where $XI_{cl}$ is the total collector current of the slave transistors $Q_{2a}$–$Q_{2n}$. Thus, since $I_{cQ4}=MI$ and $I_{cl}=I$, $M_{min}=(X+1)/hfe_{min}$ where $M_{min}$ is the minimum value needed to sustain the circuit given the values $hfe_{min}$ and X.

Figure 2:
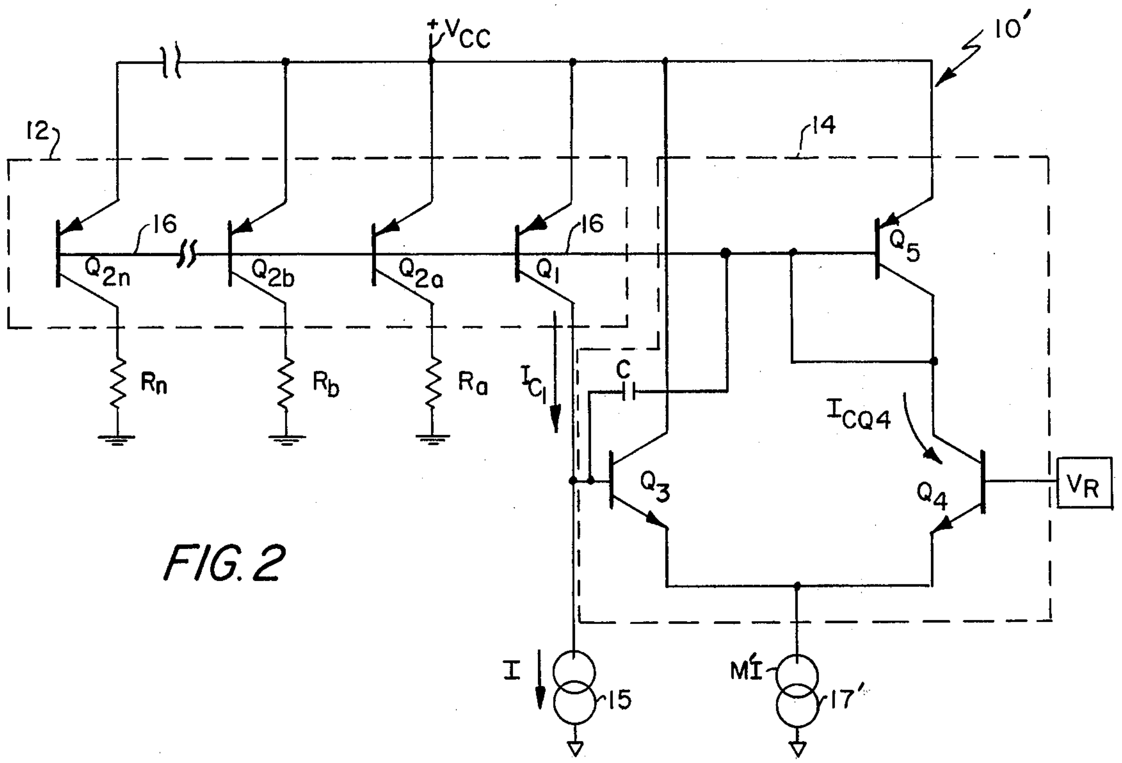
FIG. 2 is a schematic diagram of a current source circuit according to an alternative embodiment of the invention.

Referring now to FIG. 2 an alternative current source circuit 10' is shown, here such circuit 10' includes the current mirror 12, identical in construction to the current mirror 12 described in connection with FIG. 1, and a differential amplifier 14', similar in construction to the differential amplifier 14 described in connection with FIG. 1, but here, differential amplifier 14' includes a diode connected transistor $Q_5$. Transistor $Q_5$ has its emitter electrode connected to the $+V_{cc}$ voltage source, its base electrode connected to the common base electrode 16 of the current mirror 12 and also connected to its own collector electrode and that of transistor $Q_4$, as shown. Here again substantially all of the base current flowing through master transistor $Q_1$ and slave transistors $Q_{2a}$–$Q_{2n}$ of current mirror 12 passes through the collector electrode of transistor $Q_4$ (i.e. $I_{CQ4}$). Here, however, base current of transistor $Q_5$ also flows through the collector electrode of transistor $Q_4$. Circuit 10' operates in a similar manner to circuit 10 since any change in the collector current $I_{cl}$, of master transistor $Q_1$ because of a change in the supply voltage $V_{cc}$ is sensed as a change in the base current of transistor $Q_3$. This sensed change in base current of transistor $Q_3$ causes the collector current of transistor $Q_4$ (i.e. $I_{CQ4}$) to change in an opposite sense to thereby change the collector current, $I_{cl}$, of master transistor $Q_1$ to its original level and hence maintain the current $I_{cl}$, and consequently the collector currents of slave transistors $Q_{2a}$–$Q_{2n}$ at their initial levels. Here, however, the second reference current source 17' produces a minimum current $M'_{min}I$, where $M'_{min}=(n(1+hfe_{min})+X+1)/hfe_{min}$ where n the ratio of the emitter current density of transistor $Q_5$ to the emitter current density of transistor $Q_1$ and I is the current produced by current source 15.

Having described a preferred embodiment of the invention, it will now be apparent to one of skill in the art that other embodiments incorporating this concept may be used. It is felt, therefore, that this invention should not be restricted to the disclosed embodiment but rather should be limited only by the spirit and scope of the appended claims.

What is claimed is:

1. A current source circuit comprising:

(a) a pair of current sources;

(b) a current mirror circuit comprising a plurality of transistors having a common base electrode, such plurality of transistors including a master transistor and at least one slave transistor, emitter electrodes thereof being electrically connected to a voltage source;

(c) differential amplifier means comprising a pair of transistors having emitter electrodes connected to a first one of the pair of current sources, a first one of the pair of transistors having a base electrode coupled to a collector electrode of the master transistor and to a second one of the pair of current sources and a collector electrode coupled to the voltage source, and a second one of the pair of transistors having a collector electrode connected to the common base electrode, for producing a current flow through the collector electrode of at least one slave transistor substantially proportional to the current flow through the collector electrode of the master transistor;

(d) wherein the differential amplifier means includes a diode connected transistor coupled between the collector electrode of the second one of the pair of transistors of the differential amplifier means and the voltage source and wherein the first one of the pair of current sources produces a mirror current MI where I is the current produced by the first one of the pair of current sources and M is at least equal to $(n(1+hfe_{min})+X+1)/hfe_{min}$ where n is the ratio of the emitter current density of the diode connected transistor to the current density of the master transistor, X is the ratio of the total collector current of the slave transistor to the collector current of the master transistor and $hfe_{min}$ is the minimum current gain of the plurality of transistors of the current mirror circuit.

* * * * *

UNITED STATES PATENT OFFICE

CERTIFICATE OF CORRECTION

Patent No. 4,437,023 Dated March 13, 1984

Inventor(s) Harry A. Gill, Jr.

It is certified that error appears in the above-identified patent and that said Letters Patent are hereby corrected as shown below:

Column 2, Line 55: Change "curent" to --current--;

Column 3, Line 41: Delete "the" (second occurrence); and

Lines 53-54: Change "$I_{cQ4-}$ + ($I_{c1/hfe}$) + ($XI_{c1/hfe}$)" to --$I_{cQ4}$ = ($I_{c1/hfe}$) + ($XI_{c1/hfe}$)--.

Signed and Sealed this

*Eighteenth* Day of *December 1984*

[SEAL]

*Attest:*

GERALD J. MOSSINGHOFF

*Attesting Officer* *Commissioner of Patents and Trademarks*